US011195090B1

United States Patent
Chang et al.

(10) Patent No.: US 11,195,090 B1
(45) Date of Patent: Dec. 7, 2021

(54) MEMORY UNIT WITH ADAPTIVE CLAMPING VOLTAGE SCHEME AND CALIBRATION SCHEME FOR MULTI-LEVEL NEURAL NETWORK BASED COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Meng-Fan Chang, Taichung (TW); Cheng-Xin Xue, Hsinchu (TW); Je-Syu Liu, New Taipei (TW); Ting-Wei Chang, New Taipei (TW); Tsung-Yuan Huang, New Taipei (TW); Hui-Yao Kao, New Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/987,372

(22) Filed: Aug. 6, 2020

(51) Int. Cl.
  *G06N 3/063* (2006.01)
  *G11C 13/00* (2006.01)

(52) U.S. Cl.
  CPC ....... *G06N 3/0635* (2013.01); *G11C 13/0026* (2013.01); *G11C 13/0028* (2013.01); *G11C 13/0038* (2013.01)

(58) Field of Classification Search
  CPC ....... G11C 7/04; G11C 7/1072; G11C 7/1078; G11C 2207/2254; G11C 13/0028; G11C 13/0026; G11C 13/0038; G06F 13/1689; G06N 3/0635
  See application file for complete search history.

(56) References Cited

U.S. PATENT DOCUMENTS

2011/0141822 A1* 6/2011 Di Iorio ............... G11C 11/5678
    365/189.2
2020/0372331 A1* 11/2020 Chang .................. G06N 3/0635

OTHER PUBLICATIONS

C.-X. Xue et al., "Embedded 1-Mb ReRAM-Based Computing-in-Memory Macro With Multibit Input and Weight for CNN-Based AI Edge Processors," in IEEE Journal of Solid-State Circuits, vol. 55, No. 1, pp. 203-215, Jan. 2020, doi: 10.1109/JSSC.2019.2951363. (Year: 2020).*

* cited by examiner

*Primary Examiner* — Ajay Ojha
(74) *Attorney, Agent, or Firm* — CKC & Partners Co., LLC

(57) ABSTRACT

A memory unit is controlled by a word line, a reference voltage and a bit-line clamping voltage. A non-volatile memory cell is controlled by the word line and stores a weight. A clamping module is electrically connected to the non-volatile memory cell via a bit line and controlled by the reference voltage and the bit-line clamping voltage. A clamping transistor of the clamping module is controlled by the bit-line clamping voltage to adjust a bit-line current. A cell detector of the clamping module is configured to detect the bit-line current to generate a comparison output according to the reference voltage. A clamping control circuit of the clamping module switches the clamping transistor according to the comparison output and the bit-line clamping voltage. When the clamping transistor is turned on by the clamping control circuit, the bit-line current is corresponding to the bit-line clamping voltage multiplied by the weight.

20 Claims, 6 Drawing Sheets

MEMORY UNIT WITH ADAPTIVE CLAMPING VOLTAGE SCHEME AND CALIBRATION SCHEME FOR MULTI-LEVEL NEURAL NETWORK BASED COMPUTING-IN-MEMORY APPLICATIONS AND COMPUTING METHOD THEREOF

BACKGROUND

Technical Field

The present disclosure relates to a memory unit and a computing method thereof. More particularly, the present disclosure relates to a memory unit with an adaptive clamping voltage scheme and a calibration scheme for a plurality of multi-level neural network based computing-in-memory applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiply-accumulate (MAC) operations for AI chips, and multiple-bit convolutional neural network (CNN) is required for high inference accuracy in many applications.

Using non-volatile memory for CIM can save time from repeatedly writing weights to memory. In addition, in order to increase the operation speed, the amount of operation information needs to be increased in one operation cycle. However, increasing the amount of information will affect each other and cause incorrect results. Therefore, how to increase the amount of computing information and eliminate the influence between information in one cycle is one of the challenges we face.

In a conventional technology, to generate multi-bit input need multiple operation cycles. In addition, the conventional technology accumulates the current of multiple memories on the bit line, and the bit line will have high-impedance and low-impedance currents. The result of currents will overlap and then send it to the sense amplifier for reading, so that the overlapping part will cause an error. Therefore, a memory unit with an adaptive clamping voltage scheme and a calibration scheme for a plurality of multi-level neural network based computing-in-memory applications and a computing method thereof having the features of reducing the power consumption and improving the accuracy of the result are commercially desirable.

SUMMARY

According to one aspect of the present disclosure, a memory unit with an adaptive clamping voltage scheme and a calibration scheme for a plurality of multi-level neural network based computing-in-memory applications is controlled by a word line, a reference voltage and a bit-line clamping voltage. The memory unit with the adaptive clamping voltage scheme and the calibration scheme for the multi-level neural network based computing-in-memory applications includes a non-volatile memory cell, a source line, a bit line and a clamping module. The non-volatile memory cell is controlled by the word line and stores a weight. The source line is electrically connected to one end of the non-volatile memory cell. The bit line is electrically connected to another end of the non-volatile memory cell and has a bit-line current. The clamping module is electrically connected to the non-volatile memory cell via the bit line and controlled by the reference voltage and the bit-line clamping voltage. The clamping module includes a clamping transistor, a cell detector and a clamping control circuit. The clamping transistor is electrically connected to the bit line. The bit-line current is flowed through the clamping transistor, and the clamping transistor is controlled by the bit-line clamping voltage to adjust the bit-line current. The cell detector is electrically connected to the clamping transistor. The cell detector is configured to detect the bit-line current to generate a comparison output according to the reference voltage. The clamping control circuit is electrically connected between the clamping transistor and the cell detector. The clamping control circuit switches the clamping transistor according to the comparison output and the bit-line clamping voltage. When the clamping transistor is turned on by the clamping control circuit, the bit-line current is corresponding to the bit-line clamping voltage multiplied by the weight.

According to another aspect of the present disclosure, a memory unit with an adaptive clamping voltage scheme and a calibration scheme for a plurality of multi-level neural network based computing-in-memory applications is controlled by a word line, a reference voltage and a bit-line clamping voltage. The memory unit with the adaptive clamping voltage scheme and the calibration scheme for the multi-level neural network based computing-in-memory applications includes two non-volatile memory cells, a source line, two bit lines and two clamping modules. The two non-volatile memory cells are controlled by the word line and storing two weights, respectively. The source line (SL) is electrically connected to one end of each of the two non-volatile memory cells. Each of the two bit lines is electrically connected to another end of each of the two non-volatile memory cells, and each of the two bit lines has a bit-line current. The two clamping modules are electrically connected to the two non-volatile memory cells via the two bit lines, respectively. The two clamping modules are controlled by the reference voltage and the bit-line clamping voltage. Each of the two clamping modules includes a clamping transistor, a cell detector and a clamping control circuit. The clamping transistor is electrically connected to one of the two bit lines. The bit-line current is flowed through the clamping transistor, and the clamping transistor is controlled by the bit-line clamping voltage to adjust the bit-line current. The cell detector is electrically connected to the clamping transistor. The cell detector is configured to detect the bit-line current to generate a comparison output according to the reference voltage. The clamping control circuit is electrically connected between the clamping transistor and the cell detector. The clamping control circuit switches the clamping transistor according to the comparison output and the bit-line clamping voltage. When the clamping transistor is turned on by the clamping control circuit, the bit-line currents of the two bit lines are corresponding to the bit-line clamping voltage multiplied by the two weights, respectively.

According to further another aspect of the present disclosure, a computing method of the memory unit with the adaptive clamping voltage scheme and the calibration scheme for the multi-level neural network based computing-in-memory applications includes performing a voltage level applying step and a computing step. The voltage level applying step includes applying a plurality of voltage levels to the reference voltage, the bit-line clamping voltage and the word line, respectively. The computing step includes driving the clamping transistor, the cell detector and the clamping control circuit to generate the bit-line current on the bit line according to the reference voltage and the bit-line clamping voltage. When the clamping transistor is turned on by the clamping control circuit, the bit-line current is corresponding to the bit-line clamping voltage multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
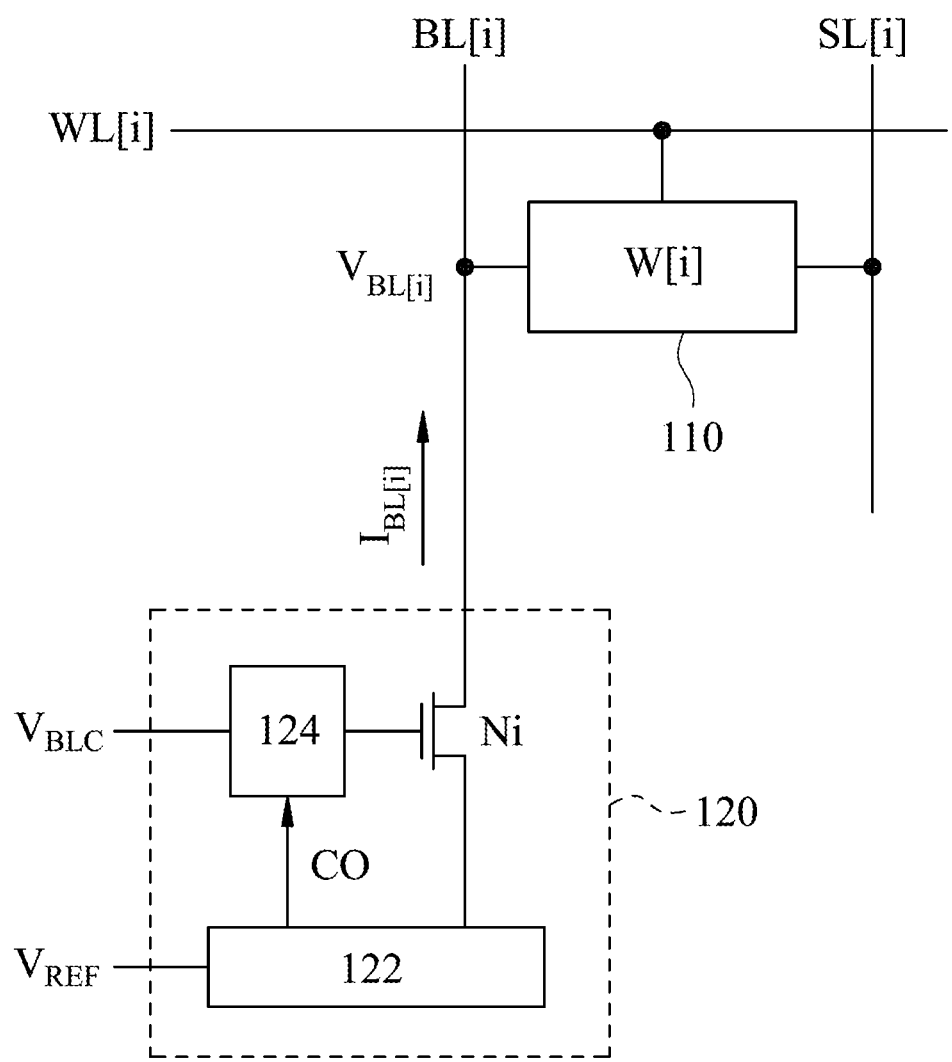
FIG. 1 shows a block diagram of a memory unit with an adaptive clamping voltage scheme and a calibration scheme for a plurality of multi-level neural network based computing-in-memory applications according to a first embodiment of the present disclosure.

Please refer to FIG. 1. FIG. 1 shows a block diagram of a memory unit 100 with an adaptive clamping voltage scheme and a calibration scheme for a plurality of multi-level neural network based computing-in-memory applications according to a first embodiment of the present disclosure. The memory unit 100 with the adaptive clamping voltage scheme and the calibration scheme for the multi-level neural network based computing-in-memory applications is controlled by a word line WL[i], a reference voltage $V_{REF}$ and a bit-line clamping voltage $V_{BLC}$, and includes a non-volatile memory cell 110, a source line SL[i], a bit line BL[i] and a clamping module 120.

The non-volatile memory cell 110 is controlled by the word line WL[i] and stores a weight W[i]. The source line SL[i] is electrically connected to one end of the non-volatile memory cell 110. The bit line BL[i] is electrically connected to another end of the non-volatile memory cell 110 and has a bit-line current $I_{BL[i]}$ and a bit-line voltage $V_{BL[i]}$. The bit-line current $I_{BL[i]}$ represents a current flowed through the bit line BL[i]. The bit-line voltage $V_{BL[i]}$ represents a voltage level of the bit line BL[i]. The clamping module 120 is electrically connected to the non-volatile memory cell 110 via the bit line BL[i] and controlled by the reference voltage $V_{REF}$ and the bit-line clamping voltage $V_{BLC}$. The clamping module 120 includes a clamping transistor Ni, a cell detector 122 and a clamping control circuit 124. The clamping transistor Ni is electrically connected to the bit line BL[i]. The bit-line current $I_{BL[i]}$ is flowed through the clamping transistor Ni, and the clamping transistor Ni is controlled by the bit-line clamping voltage $V_{BLC}$ to adjust the bit-line current $I_{BL[i]}$. The cell detector 122 is electrically connected to the clamping transistor Ni. The cell detector 122 is configured to detect the bit-line current $I_{BL[i]}$ to generate a comparison output CO according to the reference voltage $V_{REF}$. The clamping control circuit 124 is electrically connected between the clamping transistor Ni and the cell detector 122. The clamping control circuit 124 switches the clamping transistor Ni according to the comparison output CO and the bit-line clamping voltage $V_{BLC}$. When the clamping transistor Ni is turned on by the clamping control circuit 124, the bit-line current $I_{BL[i]}$ is corresponding to the bit-line clamping voltage $V_{BLC}$ multiplied by the weight W[i]. In other words, the bit-line current $I_{BL[i]}$ is corresponding to the bit-line voltage $V_{BL[i]}$ multiplied by the weight W[i]. "i" is an integer which is greater than or equal to 0. Therefore, the memory unit 100 with the adaptive clamping voltage scheme and the calibration scheme for the multi-level neural network based computing-in-memory applications of the present disclosure utilizes different bit-line clamping voltages $V_{BLC}$ on the non-volatile memory cell 110 to generate different bit-line currents $I_{BL[i]}$ so as to increase the number of input bits in one operating cycle and improve the results which affect each other after accumulating multiple memory cells.

Figure 2:
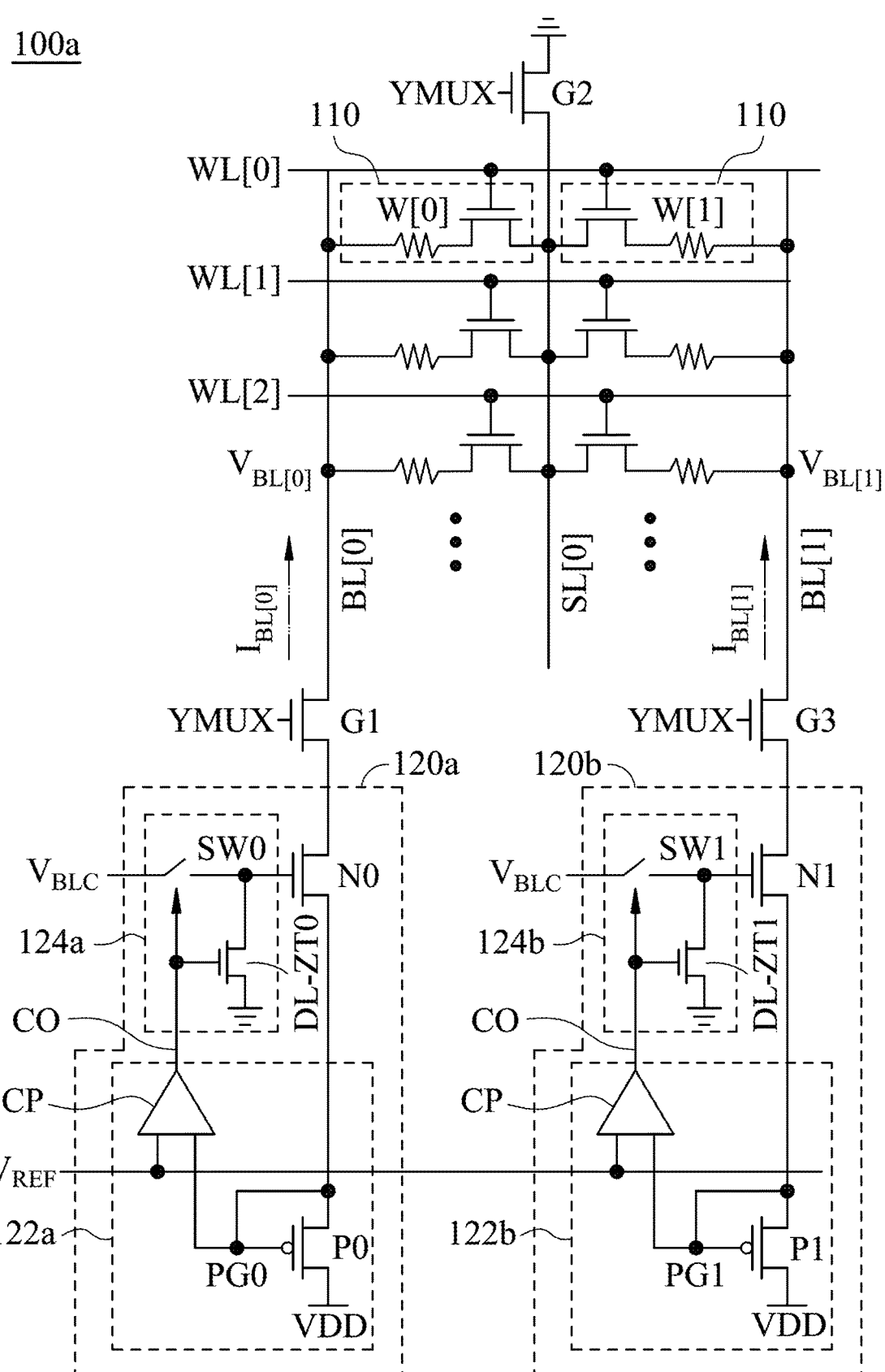
FIG. 2 shows a block diagram of a memory unit with an adaptive clamping voltage scheme and a calibration scheme for a plurality of multi-level neural network based computing-in-memory applications according to a second embodiment of the present disclosure.

Please refer to FIG. 2. FIG. 2 shows a block diagram of a memory unit 100a with an adaptive clamping voltage scheme and a calibration scheme for a plurality of multi-level neural network based computing-in-memory applications according to a second embodiment of the present disclosure. The memory unit 100a with the adaptive clamping voltage scheme and the calibration scheme for the multi-level neural network based computing-in-memory applications is controlled by a plurality of word lines (e.g., WL[0], WL[1], WL[2]), a reference voltage $V_{REF}$ and a bit-line clamping voltage $V_{BLC}$, and includes a plurality of non-volatile memory cells 110, a source line SL[0], two bit lines BL[0], BL[1], a first transmission gate G1, a second transmission gate G2, a third transmission gate G3 and two clamping modules 120a, 120b.

Two of the non-volatile memory cells 110 are controlled by the word line WL[0]. The two of the non-volatile memory cells 110 store two weights W[0], W[1], respectively. In detail, each of the non-volatile memory cells 110 includes a transistor and a resistive element. The resistive element is electrically connected to one of the two bit lines BL[0], BL[1] and stores one of the two weights W[0], W[1]. The resistive element of each of the non-volatile memory cells 110 is in one of a high resistance state (HRS) and a low resistance state (LRS). The transistor is electrically connected between the resistive element and the source line SL[0]. The transistor is the NMOS transistor.

The source line SL[0] is electrically connected to one end of each of the two non-volatile memory cells 110, and the two non-volatile memory cells 110 are connected to one of the word lines (e.g., WL[0]). The source line SL[0] is coupled to the ground voltage VSS via the second transmission gate G2.

Each of the two bit lines BL[0], BL[1] is electrically connected to another end of each of the two non-volatile memory cells 110, and each of the two bit lines BL[0], BL[1] has a bit-line current (i.e., one of $I_{BL[0]}$, $I_{BL[1]}$). The voltage level (i.e., one of the bit-line voltages $V_{BL[0]}$, $V_{BL[1]}$) of each of the two bit lines BL[0], BL[1] is smaller than the power supply voltage VDD.

The first transmission gate G1 is electrically connected between one end of one of the two non-volatile memory cells 110 and one of the two clamping modules 120a, 120b. The second transmission gate G2 is electrically connected between another end of the one of the two non-volatile memory cells 110 and the ground voltage VSS. In other words, the second transmission gate G2 is electrically connected between the source line SL[0] and the ground voltage VSS. The third transmission gate G3 is electrically connected between one end of another of the two non-volatile memory cells 110 and another of the two clamping modules 120a, 120b. The first transmission gate G1, the second transmission gate G2 and the third transmission gate G3 are controlled by a pass enable signal YMUX. Each of the first transmission gate G1, the second transmission gate G2 and the third transmission gate G3 is the NMOS transistor.

The two clamping modules 120a, 120b are electrically connected to the two non-volatile memory cells 110 via the two bit lines BL[0], BL[1], respectively. The two clamping modules 120a, 120b are controlled by the reference voltage $V_{REF}$ and the bit-line clamping voltage $V_{BLC}$. The clamping module 120a includes a clamping transistor N0, a cell detector 122a and a clamping control circuit 124a.

The clamping transistor N0 is electrically connected to the bit line BL[0] via the first transmission gate G1. The bit-line current $I_{BL[0]}$ is flowed through the clamping transistor N0, and the clamping transistor N0 is controlled by the bit-line clamping voltage $V_{BLC}$ to adjust the bit-line current $I_{BL[0]}$. In detail, the clamping transistor N0 is the NMOS transistor. The clamping transistor N0 has a clamping gate, a clamping drain and a clamping source. The clamping gate is coupled to the clamping control circuit 124a. The clamping drain is coupled to a detecting node PG0, and the clamping source is coupled to the bit line BL[0] via the first transmission gate G1.

The cell detector 122a is electrically connected to the clamping transistor N0. The cell detector 122a is configured to detect the bit-line current $I_{BL[0]}$ to generate a comparison output CO according to the reference voltage $V_{REF}$. In detail, the cell detector 122a includes a detecting transistor PO and a comparator CP. The detecting transistor PO is electrically connected between the clamping transistor N0 and the power supply voltage VDD. The detecting transistor PO is electrically connected to the clamping transistor N0 via a detecting node PG0. In other words, the detecting node PG0 is connected between the comparator CP and the detecting transistor PO. The detecting transistor PO has a detecting gate, a detecting drain and a detecting source. The detecting gate is coupled to the detecting drain. The detecting drain is coupled to the detecting node PG0, and the detecting source is coupled to the power supply voltage VDD. The detecting transistor PO is the PMOS transistor. In addition, the comparator CP is electrically connected between the detecting node PG0 and the clamping control circuit 124a. The comparator CP generates the comparison output CO by comparing a voltage level of the detecting node PG0 with the reference voltage $V_{REF}$. The comparator CP may be a sense amplifier.

The clamping control circuit 124a is electrically connected between the clamping transistor N0 and the cell detector 122a. The clamping control circuit 124a switches the clamping transistor N0 according to the comparison output CO and the bit-line clamping voltage $V_{BLC}$. When the clamping transistor N0 is turned on by the clamping control circuit 124a, the bit-line current $I_{BL[0]}$ of the bit line BL[0] is corresponding to the bit-line clamping voltage $V_{BLC}$ multiplied by the weight W[0]. The bit-line current $I_{BL[0]}$ ($I_{BL[i]}$ with i=0) can be described as follows:

$$I_{BL[i]} = V_{BLC} \times W[i] = V_{BL[i]} \times W[i] = (k \times I_{HRS}) \text{ or } (k \times I_{LRS}),$$
$$k = 0, 1, \ldots n, \; i = 0 \qquad (1).$$

In detail, the clamping control circuit 124a includes a two-terminal switching element SW0 and a clamping control transistor DL-ZT0. The two-terminal switching element SW0 is electrically connected between the bit-line clamping voltage $V_{BLC}$ and the clamping transistor N0. The two-terminal switching element SW0 is controlled by the comparison output CO. The clamping control transistor DL-ZT0 is electrically connected to the two-terminal switching element SW0. The clamping control transistor DL-ZT0 is switched by the comparison output CO. The clamping control transistor DL-ZT0 has a control gate, a control drain and a control source. The control gate is coupled to the comparison output CO. The control drain is coupled to the clamping gate of the clamping transistor N0. The control source is coupled to the ground voltage VSS. The clamping control transistor DL-ZT0 is the NMOS transistor.

Similarly, the clamping module 120b includes a clamping transistor N1, a cell detector 122b and a clamping control circuit 124b. The detail of the clamping transistor N1, the cell detector 122b and the clamping control circuit 124b of the clamping module 120b is the same as the clamping transistor N0, the cell detector 122a and the clamping control circuit 124a of the clamping module 120a, and will not be described again herein.

Figure 3:
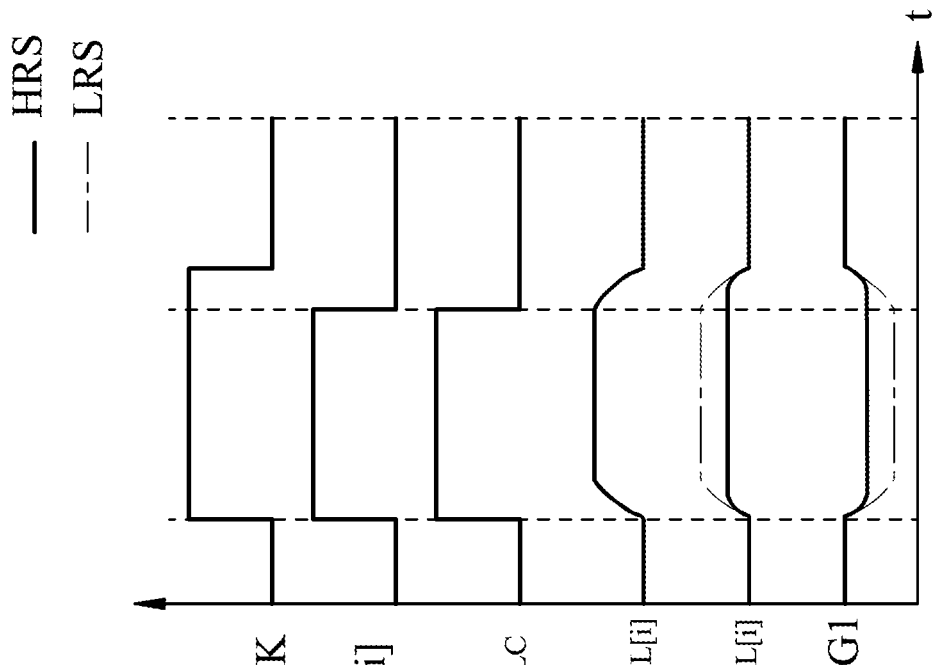
FIG. 3 shows timing diagrams of the memory unit of FIG. 2, with the adaptive clamping voltage scheme.

Please refer to FIGS. 2 and 3. FIG. 3 shows timing diagrams of the memory unit 100a of FIG. 2, with the adaptive clamping voltage scheme. "CLK" represents a clock signal. "Level1" and "Level2" represent different bit-line clamping voltages $V_{BLC}$, respectively, and "Input_multilevel" represents that the different bit-line clamping voltages $V_{BLC}$ have multilevel voltages. The adaptive clamping voltage scheme is to utilize different bit-line clamping voltages $V_{BLC}$ on the non-volatile memory cell 110 to generate different bit-line currents $I_{BL[i]}$, where i=0 or 1. Through different bit-line clamping voltages $V_{BLC}$, different cross voltages can be generated on the non-volatile memory cell 110. The architecture of the memory unit 100a of the present disclosure can generate different currents without using multiple memory cells, thereby effectively improving the utilization rate of the memory cells. The improved utilization rate can also reduce the power consumption caused by the large current accumulated on the bit line BL[i].

Figure 4:
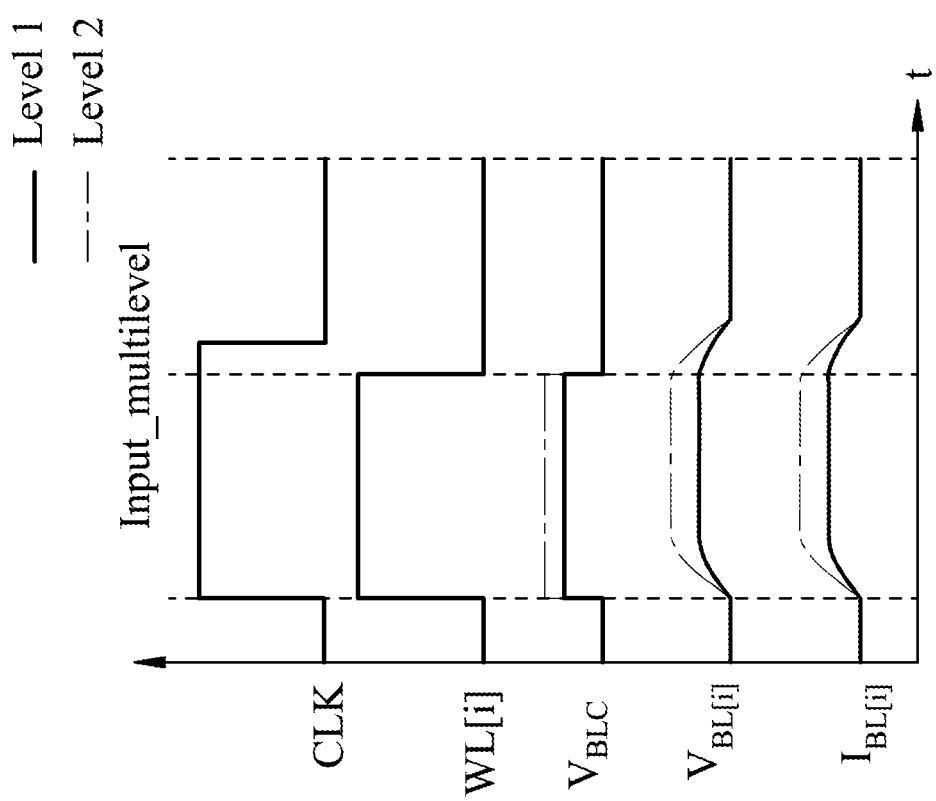
FIG. 4 shows timing diagrams of the memory unit of FIG. 2, with different resistance states (HRS/LRS).

Please refer to FIGS. 2 and 4. FIG. 4 shows timing diagrams of the memory unit 100a of FIG. 2, with different resistance states. When the non-volatile memory cell 110 is in the HRS with i being 0, the bit-line current $I_{BL[0]}$ is low, and the voltage level of the detecting node PG0 is high. When the non-volatile memory cell 110 is in LRS with i being 0, the bit-line current $I_{BL[0]}$ is high, and the voltage level of the detecting node PG0 is low. Moreover, when the non-volatile memory cell 110 is in the HRS with i being 1, the bit-line current $I_{BL[1]}$ is low, and the voltage level of the detecting node PG1 is high. When the non-volatile memory cell 110 is in LRS with i being 1, the bit-line current $I_{BL[1]}$ is high, and the voltage level of the detecting node PG1 is low.

Figure 5:
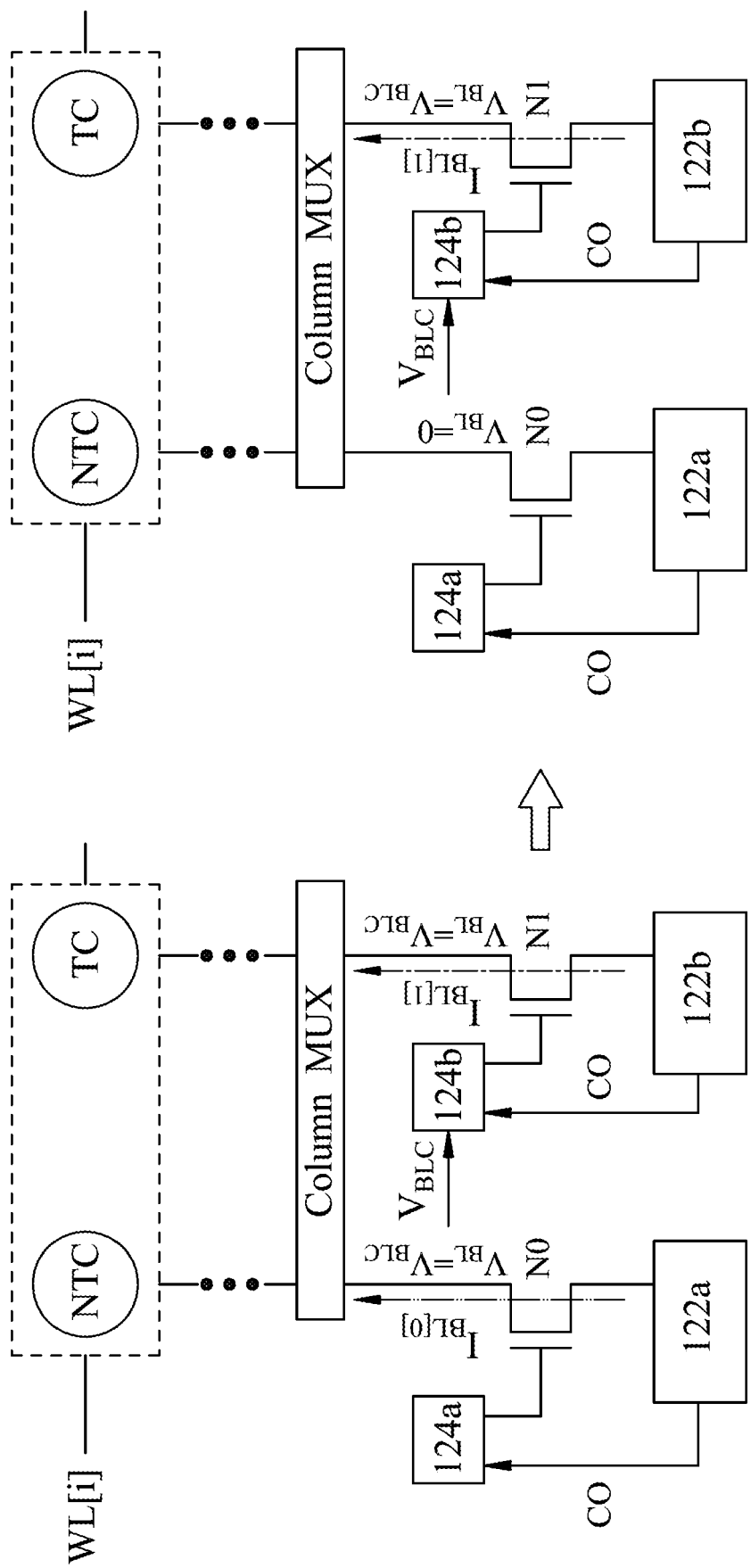
FIG. 5 shows a schematic view of the memory unit of FIG. 2, with the calibration scheme.

Please refer to FIGS. 2 and 5. FIG. 5 shows a schematic view of the memory unit 100a of FIG. 2, with the calibration scheme. "NTC" and "TC" represent a non-target cell and a target cell, respectively. "Column MUX" represents a set of the first transmission gate G1 and the third transmission gate G3. The calibration scheme is to utilize non-target resistance cancellation on one of the bit lines BL[0], BL[1] by one of the cell detectors 122a, 122b to eliminate the non-target resistance current. In other words, the calibration scheme is to eliminate the influence between information by blocking the non-target resistance current. After blocking, the accumulation results of the non-volatile memory cells 110 are only corresponding to the target resistance current. The accumulation results can be achieved on one of the bit lines BL[0], BL[1] with the linear target resistance current and minimum impact between data. The cell detectors 122a, 122b are used to detect the bit lines BL[0], BL[1], respectively. The comparison outputs CO of the cell detectors 122a, 122b are used to control the clamping control circuit 124a, 124b, respectively. If the detection result of the non-volatile memory cell 110 is a target resistance (i.e., the target cell TC), the clamping control circuit 124b operates normally. If the detection result of the non-volatile memory cell 110 is a non-target resistance (i.e., the non-target cell NTC), the clamping transistor N0 is turned off by the clamping control circuit 124a. A current with only the target resistance can be obtained, and a linear result with the target resistance current is generated on each of the bit lines BL[0], BL[1]. Therefore, the memory unit 100a with the adaptive clamping voltage scheme and the calibration scheme for the multi-level neural network based computing-in-memory applications of the present disclosure utilizes different bit-line clamping voltages $V_{BLC}$ on the non-volatile memory cell 110 to generate different bit-line currents (e.g., any one of $I_{BL[0]}$ and $I_{BL[1]}$ has different values) so as to increase the number of input bits in one operating cycle and improve the results which affect each other after accumulating multiple memory cells.

Figure 6:
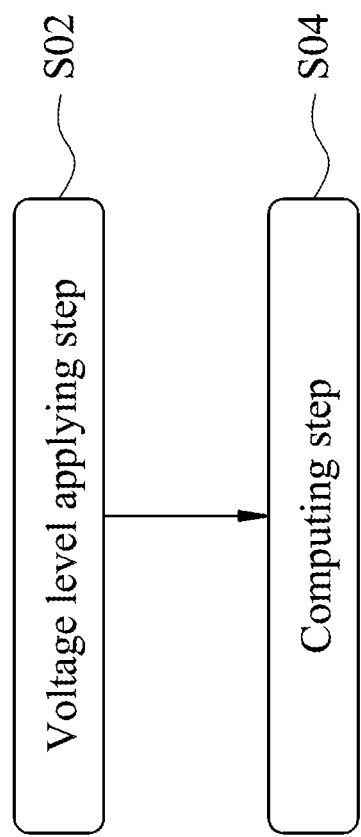
FIG. 6 shows a flow chart of a computing method of a memory unit with an adaptive clamping voltage scheme and a calibration scheme for a plurality of multi-level neural network based computing-in-memory applications according to a third embodiment of the present disclosure.

Please refer to FIGS. 1 and 6. FIG. 6 shows a flow chart of a computing method 200 of a memory unit 100 with an adaptive clamping voltage scheme and a calibration scheme for a plurality of multi-level neural network based computing-in-memory applications according to a third embodiment of the present disclosure. The computing method 200 includes performing a voltage level applying step S02 and a computing step S04. The voltage level applying step S02 includes applying a plurality of voltage levels to the reference voltage $V_{REF}$, the bit-line clamping voltage $V_{BLC}$ and the word line WL[i], respectively. The computing step S04 includes driving the clamping transistor Ni, the cell detector 122 and the clamping control circuit 124 to generate the bit-line current $I_{BL[i]}$ on the bit line BL[i] according to the reference voltage $V_{REF}$ and the bit-line clamping voltage $V_{BLC}$. When the clamping transistor Ni is turned on by the clamping control circuit 124, the bit-line current $I_{BL[i]}$ is corresponding to the bit-line clamping voltage $V_{BLC}$ multiplied by the weight W[i]. Therefore, the computing method 200 of the present disclosure utilizes different bit-line clamping voltages $V_{BLC}$ on the non-volatile memory cell 110 to generate different bit-line currents $I_{BL[i]}$ so as to increase the number of input bits in one operating cycle and improve the results which affect each other after accumulating multiple memory cells.

Figure 7:
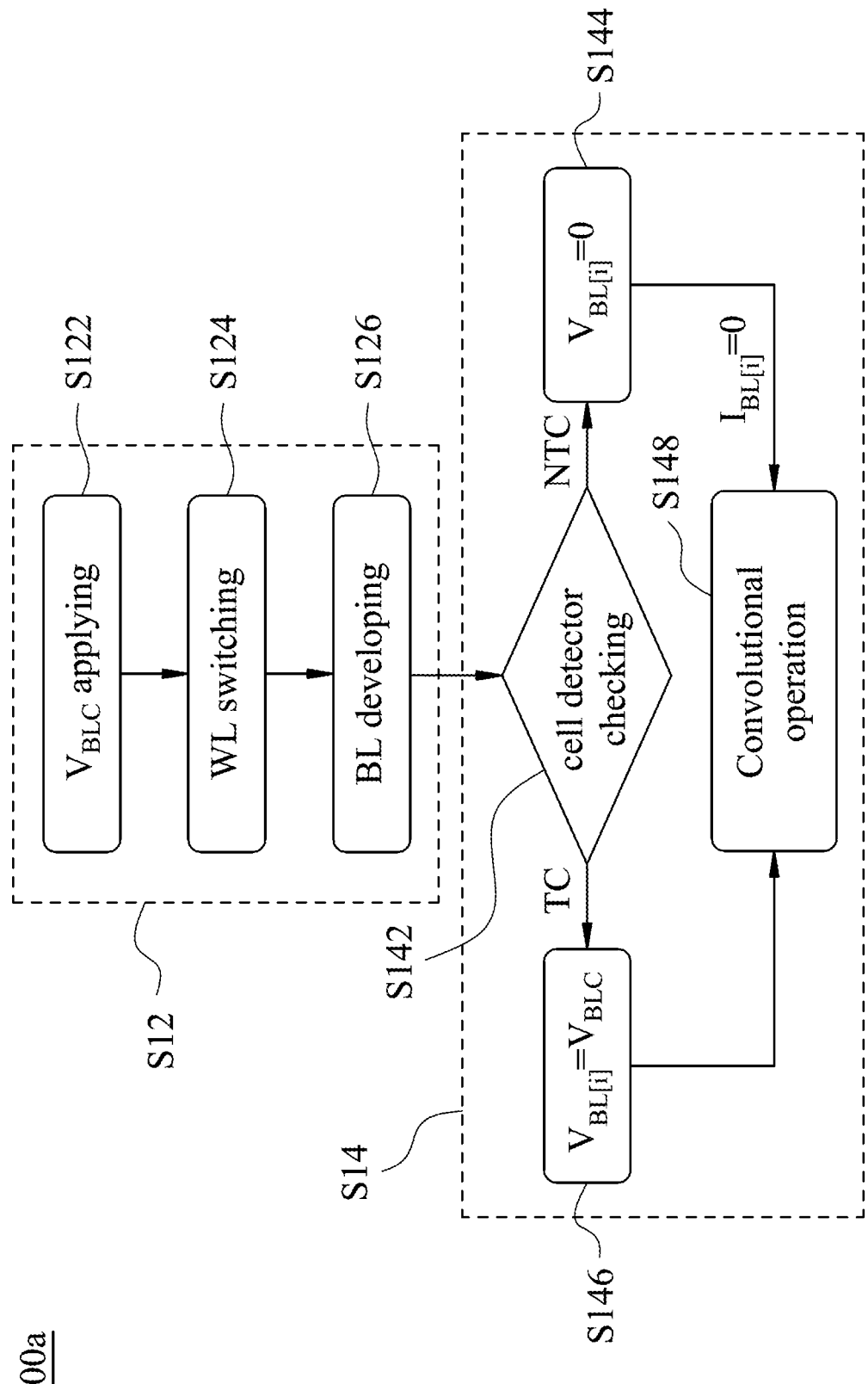
FIG. 7 shows a flow chart of a computing method of a memory unit with an adaptive clamping voltage scheme and a calibration scheme for a plurality of multi-level neural network based computing-in-memory applications according to a fourth embodiment of the present disclosure.

Please refer to FIGS. 2 and 7. FIG. 7 shows a flow chart of a computing method 200a of a memory unit 100a with an adaptive clamping voltage scheme and a calibration scheme for a plurality of multi-level neural network based computing-in-memory applications according to a fourth embodiment of the present disclosure. The computing method 200a includes performing a voltage level applying step S12 and a computing step S14.

The voltage level applying step S12 includes applying a plurality of voltage levels to the reference voltage $V_{REF}$, the bit-line clamping voltage $V_{BLC}$ and the word lines (e.g., WL[0], WL[1], WL[2]), respectively. In detail, the voltage level applying step S12 includes performing an input voltage applying step S122, a word-line switching step S124 and a bit-line developing step S126. The input voltage applying step S122 includes applying the bit-line clamping voltage $V_{BLC}$ which is regarded as an input voltage of accumulation. The word-line switching step S124 includes turning on the word lines by applying the voltage level (e.g., the power supply voltage VDD) to the word lines. The bit-line developing step S126 includes developing the bit line (e.g., BL[0] or BL[1]) during a developing time period.

The computing step S14 includes driving the clamping transistors N0, N1, the cell detectors 122a, 122b and the clamping control circuits 124a, 124b to generate the bit-line currents $I_{BL[0]}$, $I_{BL[1]}$ on the bit lines BL[0], BL[1] according to the reference voltage $V_{REF}$ and the bit-line clamping voltage $V_{BLC}$. When the clamping transistor N1 is turned on by the clamping control circuit 124b, the bit-line current $I_{BL[1]}$ is corresponding to the bit-line clamping voltage $V_{BLC}$ multiplied by the weight W[1].

In detail, the computing step S14 includes performing a cell detector checking step S142, a first clamping step S144, a second clamping step S146 and a convolutional operating step S148.

The cell detector checking step S142 includes enabling the cell detectors 122a, 122b to check the bit-line currents $I_{BL[0]}$, $I_{BL[1]}$ to generate the comparison output CO according to the reference voltage $V_{REF}$. A comparator CP of each of the cell detectors 122a, 112b is driven to generate the comparison output CO by comparing a voltage level of a detecting node (e.g., PG0 or PG1) of each of the cell detectors 122a, 122b with the reference voltage $V_{REF}$.

When a voltage level of the comparison output CO is high, the first clamping step S144 is performed. In the first clamping step S144, a two-terminal switching element SW0 of the clamping control circuit 124a is turned off. A clamping control transistor DL-ZT0 of the clamping control circuit 124a is turned on to pull down a voltage level of a clamping gate of the clamping transistor N0, and the clamping transistor N0 is not controlled by the bit-line clamping voltage $V_{BLC}$. In other words, when the clamping transistor N0 is turned off by the clamping control circuit 124a, the bit-line current $I_{BL[0]}$ is set to zero.

When the voltage level of the comparison output CO is low, the second clamping step S146 is performed. In the second clamping step S146, a two-terminal switching element SW1 of the clamping control circuit 124b is turned on, and a clamping control transistor DL-ZT1 of the clamping control circuit 124b is turned off. The clamping transistor N1 is controlled by the bit-line clamping voltage $V_{BLC}$ to adjust the bit-line current $I_{BL[1]}$. In response to determining that the bit-line clamping voltage $V_{BLC}$ is changed, the bit-line current $I_{BL[1]}$ is changed.

The convolutional operating step S148 includes performing a convolutional operation according to the bit-line clamping voltage $V_{BLC}$ and the weight W[1].

Therefore, the computing method 200a of the present disclosure utilizes different bit-line clamping voltages $V_{BLC}$ on the non-volatile memory cell 110 to generate different bit-line currents (e.g., any one of $I_{BL[0]}$ and $I_{BL[1]}$ has different values) so as to increase the number of input bits in one operating cycle and improve the results which affect each other after accumulating multiple memory cells.

According to the aforementioned embodiments and examples, the advantages of the present disclosure are described as follows.

1. The memory unit with the adaptive clamping voltage scheme and the calibration scheme for the multi-level neural network based computing-in-memory applications and the computing method thereof of the present disclosure can generate different currents without using multiple memory cells, thereby effectively improving the utilization rate of the memory cells. The improved utilization rate can also reduce the power consumption caused by the large current accumulated on the bit line.

2. The memory unit with the adaptive clamping voltage scheme and the calibration scheme for the multi-level neural network based computing-in-memory applications and the computing method thereof of the present disclosure utilize different bit-line clamping voltages on the non-volatile memory cell to generate different bit-line currents so as to increase the number of input bits in one operating cycle and improve the results which affect each other after accumulating multiple memory cells.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit with an adaptive clamping voltage scheme and a calibration scheme for a plurality of multi-level neural network based computing-in-memory applications, which is controlled by a word line, a reference voltage and a bit-line clamping voltage, and the memory unit with the adaptive clamping voltage scheme and the calibration scheme for the multi-level neural network based computing-in-memory applications comprising:
   a non-volatile memory cell controlled by the word line and storing a weight;
   a source line electrically connected to one end of the non-volatile memory cell;
   a bit line electrically connected to another end of the non-volatile memory cell and having a bit-line current; and
   a clamping module electrically connected to the non-volatile memory cell via the bit line and controlled by the reference voltage and the bit-line clamping voltage, wherein the clamping module comprises:
      a clamping transistor electrically connected to the bit line, wherein the bit-line current is flowed through the clamping transistor, and the clamping transistor is controlled by the bit-line clamping voltage to adjust the bit-line current;
      a cell detector electrically connected to the clamping transistor, wherein the cell detector is configured to detect the bit-line current to generate a comparison output according to the reference voltage; and
      a clamping control circuit electrically connected between the clamping transistor and the cell detector, wherein the clamping control circuit switches the clamping transistor according to the comparison output and the bit-line clamping voltage;
   wherein when the clamping transistor is turned on by the clamping control circuit, the bit-line current is corresponding to the bit-line clamping voltage multiplied by the weight.

2. The memory unit with the adaptive clamping voltage scheme and the calibration scheme for the multi-level neural network based computing-in-memory applications of claim 1, wherein the non-volatile memory cell comprises:
   a resistive element electrically connected to the bit line and storing the weight; and
   a transistor electrically connected between the resistive element and the source line, wherein the source line is coupled to a ground voltage.

3. The memory unit with the adaptive clamping voltage scheme and the calibration scheme for the multi-level neural network based computing-in-memory applications of claim 1, further comprising:
   a first transmission gate electrically connected between one end of the non-volatile memory cell and the clamping transistor; and
   a second transmission gate electrically connected between another end of the non-volatile memory cell and a ground voltage;
   wherein the first transmission gate and the second transmission gate are controlled by a pass enable signal.

4. The memory unit with the adaptive clamping voltage scheme and the calibration scheme for the multi-level neural network based computing-in-memory applications of claim 1, wherein the cell detector comprises:
   a detecting transistor electrically connected between the clamping transistor and a power supply voltage, wherein the detecting transistor is electrically connected to the clamping transistor via a detecting node; and
   a comparator electrically connected between the detecting node and the clamping control circuit, wherein the comparator generates the comparison output by comparing a voltage level of the detecting node with the reference voltage.

5. The memory unit with the adaptive clamping voltage scheme and the calibration scheme for the multi-level neural network based computing-in-memory applications of claim 4, wherein,
   a voltage level of the bit line is smaller than the power supply voltage;
   the clamping transistor has a clamping gate, a clamping drain and a clamping source, the clamping gate is coupled to the clamping control circuit, the clamping drain is coupled to the detecting node, and the clamping source is coupled to the bit line; and
   the detecting transistor has a detecting gate, a detecting drain and a detecting source, the detecting gate is coupled to the detecting drain, the detecting drain is coupled to the detecting node, and the detecting source is coupled to the power supply voltage.

6. The memory unit with the adaptive clamping voltage scheme and the calibration scheme for the multi-level neural network based computing-in-memory applications of claim 1, wherein the clamping control circuit comprises:
   a two-terminal switching element electrically connected between the bit-line clamping voltage and the clamping transistor, wherein the two-terminal switching element is controlled by the comparison output; and
   a clamping control transistor electrically connected to the two-terminal switching element, wherein the clamping control transistor is switched by the comparison output.

7. The memory unit with the adaptive clamping voltage scheme and the calibration scheme for the multi-level neural network based computing-in-memory applications of claim 6, wherein,
   the clamping transistor has a clamping gate, a clamping drain and a clamping source, the clamping gate is coupled to the clamping control circuit, the clamping drain is coupled to the detecting node, and the clamping source is coupled to the bit line; and
   the clamping control transistor has a control gate, a control drain and a control source, the control gate is coupled to the comparison output, the control drain is coupled to the clamping gate, and the control source is coupled to a ground voltage.

8. A memory unit with an adaptive clamping voltage scheme and a calibration scheme for a plurality of multi-level neural network based computing-in-memory applications, which is controlled by a word line, a reference voltage and a bit-line clamping voltage, and the memory unit with the adaptive clamping voltage scheme and the calibration scheme for the multi-level neural network based computing-in-memory applications comprising:
   two non-volatile memory cells controlled by the word line and storing two weights, respectively;
   a source line electrically connected to one end of each of the two non-volatile memory cells;
   two bit lines, wherein each of the two bit lines is electrically connected to another end of each of the two non-volatile memory cells, and each of the two bit lines has a bit-line current; and
   two clamping modules electrically connected to the two non-volatile memory cells via the two bit lines, respectively, wherein the two clamping modules are controlled by the reference voltage and the bit-line clamping voltage, and each of the two clamping modules comprises:
      a clamping transistor electrically connected to one of the two bit lines, wherein the bit-line current is flowed through the clamping transistor, and the clamping transistor is controlled by the bit-line clamping voltage to adjust the bit-line current;
      a cell detector electrically connected to the clamping transistor, wherein the cell detector is configured to detect the bit-line current to generate a comparison output according to the reference voltage; and
      a clamping control circuit electrically connected between the clamping transistor and the cell detector, wherein the clamping control circuit switches the clamping transistor according to the comparison output and the bit-line clamping voltage;
   wherein when the clamping transistor is turned on by the clamping control circuit in each of the two clamping modules, the bit-line currents of the two bit lines are corresponding to the bit-line clamping voltage multiplied by the two weights, respectively.

9. The memory unit with the adaptive clamping voltage scheme and the calibration scheme for the multi-level neural network based computing-in-memory applications of claim 8, wherein each of the two non-volatile memory cells comprises:
   a resistive element electrically connected to one of the two bit lines and storing one of the two weights; and
   a transistor electrically connected between the resistive element and the source line, wherein the source line is coupled to a ground voltage.

10. The memory unit with the adaptive clamping voltage scheme and the calibration scheme for the multi-level neural network based computing-in-memory applications of claim 8, further comprising:
   a first transmission gate electrically connected between one end of one of the two non-volatile memory cells and the clamping transistor of one of the two clamping modules;
   a second transmission gate electrically connected between another end of the one of the two non-volatile memory cells and a ground voltage; and
   a third transmission gate electrically connected between one end of another of the two non-volatile memory cells and the clamping transistor of another of the two clamping modules;
   wherein the first transmission gate, the second transmission gate and the third transmission gate are controlled by a pass enable signal.

11. The memory unit with the adaptive clamping voltage scheme and the calibration scheme for the multi-level neural network based computing-in-memory applications of claim 8, wherein the cell detector of each of the two clamping modules comprises:
   a detecting transistor electrically connected between the clamping transistor and a power supply voltage, wherein the detecting transistor is electrically connected to the clamping transistor via a detecting node; and
   a comparator electrically connected between the detecting node and the clamping control circuit, wherein the comparator generates the comparison output by comparing a voltage level of the detecting node with the reference voltage.

12. The memory unit with the adaptive clamping voltage scheme and the calibration scheme for the multi-level neural network based computing-in-memory applications of claim 11, wherein, a voltage level of each of the two bit lines is smaller than the power supply voltage;

the clamping transistor has a clamping gate, a clamping drain and a clamping source, the clamping gate is coupled to the clamping control circuit, the clamping drain is coupled to the detecting node, and the clamping source is coupled to one of the two bit lines; and the detecting transistor has a detecting gate, a detecting drain and a detecting source, the detecting gate is coupled to the detecting drain, the detecting drain is coupled to the detecting node, and the detecting source is coupled to the power supply voltage.

13. The memory unit with the adaptive clamping voltage scheme and the calibration scheme for the multi-level neural network based computing-in-memory applications of claim 8, wherein the clamping control circuit of each of the two clamping modules comprises:

a two-terminal switching element electrically connected between the bit-line clamping voltage and the clamping transistor, wherein the two-terminal switching element is controlled by the comparison output; and a clamping control transistor electrically connected to the two-terminal switching element, wherein the clamping control transistor is switched by the comparison output.

14. The memory unit with the adaptive clamping voltage scheme and the calibration scheme for the multi-level neural network based computing-in-memory applications of claim 13, wherein, the clamping transistor has a clamping gate, a clamping drain and a clamping source, the clamping gate is coupled to the clamping control circuit, the clamping drain is coupled to the detecting node, and the clamping source is coupled to one of the two bit lines; and the clamping control transistor has a control gate, a control drain and a control source, the control gate is coupled to the comparison output, the control drain is coupled to the clamping gate, and the control source is coupled to a ground voltage.

15. A computing method of a memory unit with an adaptive clamping voltage scheme and a calibration scheme for a plurality of multi-level neural network based computing-in-memory applications, comprising:

performing a voltage level applying step, wherein the voltage level applying step comprises applying a plurality of voltage levels to a reference voltage, a bit-line clamping voltage and a word line, respectively; and performing a computing step, wherein the computing step comprises driving a clamping transistor, a cell detector and a clamping control circuit to generate a bit-line current on a bit line according to the reference voltage and the bit-line clamping voltage, and when the clamping transistor is turned on by the clamping control circuit, the bit-line current is corresponding to the bit-line clamping voltage multiplied by a weight;

wherein the memory unit with the adaptive clamping voltage scheme and the calibration scheme for the multi-level neural network based computing-in-memory applications comprises:

a non-volatile memory cell controlled by the word line and storing the weight;

a source line electrically connected to one end of the non-volatile memory cell;

the bit line electrically connected to another end of the non-volatile memory cell and having the bit-line current; and a clamping module electrically connected to the non-volatile memory cell via the bit line and controlled by the reference voltage and the bit-line clamping voltage, wherein the clamping module comprises:

the clamping transistor electrically connected to the bit line, wherein the bit-line current is flowed through the clamping transistor, and the clamping transistor is controlled by the bit-line clamping voltage to adjust the bit-line current;

the cell detector electrically connected to the clamping transistor, wherein the cell detector is configured to detect the bit-line current to generate a comparison output according to the reference voltage; and the clamping control circuit electrically connected between the clamping transistor and the cell detector, wherein the clamping control circuit switches the clamping transistor according to the comparison output and the bit-line clamping voltage.

16. The computing method of claim 15, wherein in the computing step, when the clamping transistor is turned off by the clamping control circuit, the bit-line current is set to zero.

17. The computing method of claim 15, wherein the computing step further comprises:

driving a comparator of the cell detector to generate the comparison output by comparing a voltage level of a detecting node of the cell detector with the reference voltage.

18. The computing method of claim 17, wherein in the computing step, when a voltage level of the comparison output is high, a two-terminal switching element of the clamping control circuit is turned off, a clamping control transistor of the clamping control circuit is turned on to pull down a voltage level of a clamping gate of the clamping transistor, and the clamping transistor is not controlled by the bit-line clamping voltage.

19. The computing method of claim 17, wherein in the computing step, when the voltage level of the comparison output is low, a two-terminal switching element of the clamping control circuit is turned on, and a clamping control transistor of the clamping control circuit is turned off.

20. The computing method of claim 19, wherein in the computing step, when the voltage level of the comparison output is low, the clamping transistor is controlled by the bit-line clamping voltage to adjust the bit-line current; and in response to determining that the bit-line clamping voltage is changed, the bit-line current is changed.

* * * * *